United States Patent
Krüger et al.

(10) Patent No.: US 9,853,204 B2
(45) Date of Patent: Dec. 26, 2017

(54) MEMS COMPONENT AND METHOD FOR ENCAPSULATING MEMS COMPONENTS

(71) Applicant: Snaptrack Inc., San Diego, CA (US)

(72) Inventors: Hans Krüger, Munich (DE); Alois Stelzl, Munich (DE); Christian Bauer, Munich (DE); Jürgen Portmann, Munich (DE); Wolfgang Pahl, Munich (DE)

(73) Assignee: SnapTrack, Inc., San Diego, CA (US)

( * ) Notice: Subject to any disclaimer, the term of this patent is extended or adjusted under 35 U.S.C. 154(b) by 11 days.

(21) Appl. No.: 14/650,538

(22) PCT Filed: Oct. 14, 2013

(86) PCT No.: PCT/EP2013/071396
§ 371 (c)(1),
(2) Date: Jun. 8, 2015

(87) PCT Pub. No.: WO2014/090438
PCT Pub. Date: Jun. 19, 2014

(65) Prior Publication Data
US 2015/0325780 A1 Nov. 12, 2015

(30) Foreign Application Priority Data
Dec. 11, 2012 (DE) .................. 10 2012 122 058

(51) Int. Cl.
| H01L 29/84 | (2006.01) |
| H01L 41/23 | (2013.01) |
| H01L 41/113 | (2006.01) |
| H01L 41/083 | (2006.01) |
| H01L 41/053 | (2006.01) |
| H01L 41/27 | (2013.01) |

(Continued)

(52) U.S. Cl.
CPC .............. *H01L 41/23* (2013.01); *B81B 7/007* (2013.01); *H01L 24/97* (2013.01); *H01L 41/053* (2013.01);

(Continued)

(58) Field of Classification Search
CPC ... H01L 41/23; H01L 41/1132; H01L 41/053; H01L 41/27; H01L 41/293;
(Continued)

(56) References Cited

U.S. PATENT DOCUMENTS

| 6,078,229 A | 6/2000 | Funada et al. |
| 7,576,426 B2 | 8/2009 | Gan et al. |

(Continued)

FOREIGN PATENT DOCUMENTS

| DE | 102008025202 A1 | 12/2009 |
| DE | 102008025202 B4 | 11/2014 |

(Continued)

OTHER PUBLICATIONS

International Search Report and Written Opinion—PCT/EP2013/071396—ISA/EPO—Apr. 28, 2014.

*Primary Examiner* — Matthew E Warren
(74) *Attorney, Agent, or Firm* — Patterson & Sheridan, L.L.P. Qualcomm

(57) ABSTRACT

A MEMS component includes, on a substrate, component structures, contact areas connected to the component structures, metallic column structures seated on the contact areas, and metallic frame structures surrounding the component structures. A cured resist layer is seated on frame structure and column structures such that a cavity is enclosed between substrate, frame structure and resist layer. A structured metallization is provided directly on the resist layer or on a carrier layer seated on the resist layer. The structured metallization includes at least external contacts of the component and being electrically conductively connected both to metallic structures and to the contact areas of the component structures.

19 Claims, 9 Drawing Sheets

(51) Int. Cl.
  *H01L 41/293* (2013.01)
  *B81B 7/00* (2006.01)
  *H01L 23/00* (2006.01)

(52) U.S. Cl.
  CPC ........ *H01L 41/083* (2013.01); *H01L 41/1132* (2013.01); *H01L 41/27* (2013.01); *H01L 41/293* (2013.01); *B81B 2207/095* (2013.01); *H01L 2224/11* (2013.01); *H01L 2224/16225* (2013.01)

(58) Field of Classification Search
  CPC . H01L 41/0533; H01L 41/297; H03H 9/0557; B81B 7/007; B81B 7/0035
  USPC .................. 257/416; 438/51; 174/50.5, 260
  See application file for complete search history.

(56) References Cited

U.S. PATENT DOCUMENTS

| | | | |
|---|---|---|---|
| 8,759,677 B2 | 6/2014 | Bauer et al. | |
| 2002/0101304 A1 | 8/2002 | Onishi et al. | |
| 2006/0151203 A1* | 7/2006 | Krueger | H03H 9/0557 174/260 |
| 2006/0220173 A1* | 10/2006 | Gan | B81C 1/00269 257/528 |
| 2006/0286718 A1 | 12/2006 | Ozaki | |
| 2010/0159643 A1 | 6/2010 | Takahashi et al. | |
| 2011/0006381 A1* | 1/2011 | Feiertag | B81B 7/007 257/416 |
| 2011/0018117 A1* | 1/2011 | Yang | H01L 24/11 257/690 |
| 2011/0114355 A1* | 5/2011 | Bauer | H01L 23/053 174/50.5 |

FOREIGN PATENT DOCUMENTS

| | | |
|---|---|---|
| JP | 2002261582 A | 9/2002 |
| JP | 2003032077 A | 1/2003 |
| JP | 2003037471 A | 2/2003 |
| JP | 2004253937 A | 9/2004 |
| JP | 2006352617 A | 12/2006 |
| JP | 2010081211 A | 4/2010 |
| JP | 2011522409 A | 7/2011 |
| WO | 2009144224 A1 | 12/2009 |

* cited by examiner

MEMS COMPONENT AND METHOD FOR ENCAPSULATING MEMS COMPONENTS

This patent application is a national phase filing under section 371 of PCT/EP2013/071396, filed Oct. 14, 2013, which claims the priority of German patent application 10 2012 112 058.7, filed Dec. 11, 2012, each of which is incorporated herein by reference in its entirety.

TECHNICAL FIELD

A MEMS component and method for encapsulating MEMS components are described.

BACKGROUND

An electronic component comprising a hermetically closed housing and a production method can be gathered from DE 102008025202 A, for example. The encapsulation method can be carried out at the wafer level. For this purpose, firstly component structures for a multiplicity of electronic components are produced simultaneously on a component wafer. On the wafer, a metallic frame is produced around the component structures of each component, said metallic frame enclosing the component structures. A covering film comprising at least one metal layer is then placed onto said frame and fixedly soldered to the metallic frame.

SUMMARY

Embodiments of the present invention specify a MEMS component and a method for encapsulating MEMS components, which MEMS component has a simplified construction and is simple to produce.

The MEMS component comprises a substrate having an active surface, on which electrical component structures and contact areas for making electrical contact with the component structures are arranged. In addition, metallic structures in the form of column structures and a frame structure are arranged on the active surface of the substrate. The metallic column structures are situated on the contact areas and project beyond the component structures. The metallic frame structure encloses the component structures on the surface of the substrate.

The component structures together with a portion of the column structures are arranged in a cavity that is formed and closed off by a cured resist layer seated on the frame structure and the column structures. In this case, the resist layer can be UV-cured or thermally cured. At least one portion of the metallic structures, that is to say at least one portion of the column structures and the frame structure, in this case penetrates through the resist layer in such a way that those surfaces of the metallic structures which face away from the substrate terminate flush with the outwardly facing surface of the resist layer. A structured metallization is provided above that surface of the resist layer which faces away from the substrate, or on a further embossing layer arranged directly above the resist layer. At least connection areas for making contact with the MEMS component are formed from said structured metallization. Therefore, the structured metallization is electrically conductively connected at least to the column structures penetrating through the resist layer, and thus also to the component structures.

The proposed MEMS component can be produced in a simple manner. It is also cost-effective on account of the materials used.

The closure of the cavity is effected by means of the cured resist layer rather than by means of a solder, with the result that elevated temperatures, such as are required for melting solder, for instance, are not necessary for sealing the cavity. The lowest thermal loading is obtained with the use of a UV-curing resist. Since MEMS components, in particular, can react sensitively toward thermomechanically generated stresses with deviation of their component properties, a component produced at low process temperatures can be produced with high manufacturing reliability. The production method produces few rejects and thereby additionally lowers the costs of the component.

The MEMS component comprises mechanically sensitive component structures which, for reliable operation, require a cavity housing such as is made available by the invention. The component structures comprise movable parts, wherein the movement can also constitute an oscillation. One class of MEMS components which preferably require hermetic cavity housings is components which operate with acoustic waves. These can be SAW components (SAW=surface acoustic wave) that operate with surface acoustic waves. It is also possible for the MEMS component to be embodied as an FBAR resonator (FBAR=thin film acoustic resonator) or FBAR filter, the component structures of which comprise resonators that operate with bulk acoustic waves. Diverse sensors can also be embodied in the form of MEMS components.

In one embodiment, a carrier layer is arranged above the resist layer. The structured metallization with the external contacts is then arranged on that surface of the carrier layer which faces away from the substrate.

Plated-through holes are provided through the carrier layer and connect the external contacts to the metallic structures. Electrically conductive connections to individual column structures, to all the column structures and optionally also to the frame structure can be provided in this case.

In a simple first embodiment, the cured resist layer serves as the sole cover layer of the cavity housing. In conjunction with the carrier layer arranged thereon in accordance with a further embodiment, the cured resist layer serves as connecting and sealing layer. The mechanical stability of the cavity housing or the cover thereof can be ensured solely by the carrier layer. The resist layer can then be made correspondingly thin. It is also possible, however, to make the resist layer correspondingly thicker and to ensure the mechanical stability by means of correspondingly dimensioned combinations of resist layer and carrier layer that are coordinated with one another.

In one configuration of the MEMS component, a hermetic layer is arranged on the rear side of the substrate, said rear side being situated opposite the active surface of the component, and seals the component relative to the carrier layer. The hermetic layer therefore preferably comprises an inorganic layer, for example, an impermeable oxide or a nitride layer or, in particular, a metal layer.

A hermetic housing is obtained if the carrier layer is also hermetically impermeable and has no or only a low permeability to gases, moisture or such liquids which could jeopardize or corrode the component structures or which could disturb the operation of the MEMS component.

A further possibility consists in also sealing the rear side of the carrier layer with a further hermetic layer, for example, with a structured passivation layer which is arranged above the contact structure and in which the external contacts are exposed.

In one embodiment, the substrate is a piezoelectric wafer and the component structures comprise an interdigital transducer. The carrier layer is preferably embodied as a glass film. In a manner appropriately matched to this, the hermetic layer can then be embodied as a metallic layer.

A MEMS component embodied in this way comprises an SAW component which can be produced cost-effectively with the glass film as carrier layer and the resist layer as connecting layer. The metallic layer as hermetic layer yields firstly an impermeability toward aggressive environmental conditions and secondly a shielding against electromagnetic radiation, thereby preventing an electromagnetic interaction of the component structures with the outside world.

A MEMS component is produced by a procedure in which electrical component structures and contact areas connected thereto are produced on an active surface of a wafer. Furthermore, metallic structures are produced on the active surface, said metallic structures comprising column structures situated on the contact areas and a frame structure enclosing the component structures, wherein the frame structure is likewise seated on the active surface of the wafer. In a further step, the surface of the metallic structures is planarized by means of a suitable method, for example by grinding away or milling.

Afterward, a carrier layer is placed onto the metallic structures with the aid of a UV-curable resist layer and is fixedly connected thereto by virtue of the resist layer being cured by means of UV irradiation. By virtue of the carrier layer being adhesively bonded with the aid of a UV-curable resist layer, a simple method for producing a cavity housing for the MEMS components is specified, which can be carried out at the wafer level.

The UV irradiation can be carried out at room temperature, wherein the component can be reliably prevented from being heated to an excessively great extent. Consequently, practically all steps for manufacturing both the component and the encapsulation thereof can be carried out at ambient temperatures, such that the housing can be closed without a thermal strain occurring between differently expanding housing parts in the process. A stress-free housing guarantees that the component fixedly connected thereto also remains stress-free. Such a component firstly is less susceptible to damage and secondly also exhibits no alteration of its thermomechanical and ultimately also electrical properties which could be associated with a mechanical strain.

In one embodiment, a further metal ply is applied on a portion of the metallic structures after the planarization. A renewed planarization step can then be carried out. As a result, metallic structures are obtained which have at least two different heights above the surface of the substrate. The upper ends of the metallic structures of each metal ply lie in each case within one plane.

The carrier layer is preferably coated with the resist layer over the whole area and then placed onto the metallic structures such that that portion of the metallic structures which is coated with the further metal ply penetrates through the resist layer until it comes into contact with the surface of the carrier layer. In this case, the thickness of the resist layer is chosen to be thicker than the height of the further metal ply. This guarantees that the surfaces of all the metallic structures are embedded in the resist layer, wherein only those portions of the metallic structures which are provided with the second metal ply extend as far as the carrier layer.

This embodiment has the advantage that, owing to the metallic structures embodied with different heights, only the structures having the greater height can be contacted in a contacting method in a simple manner.

In a further embodiment, blind holes are produced in the carrier layer and extend through the carrier layer and the surfaces of at least the metallic structures thickened with the second metal ply are exposed in said blind holes. For the case where all the metallic structures have the same height, the metallic structures to be exposed in the blind holes can be freely selected.

A structured contact structure is then applied to that surface of the carrier layer which faces away from the substrate/wafer such that it is electrically connected to the metallic structures exposed in the blind holes. For this purpose, either an application method is chosen which produces/deposits a conductive contact layer in the blind holes as well. However, it is also possible firstly to fill the blind holes with conductive materials and subsequently to choose an application method for a contact layer or a contact structure which can be carried out on a planar surface.

The contact structure can also be produced in a directly structured manner or is firstly applied as a whole-area contact layer and subsequently structured.

The contact structure can also be a wiring structure in which electrically conductive connections are produced between different metallic structures exposed in blind holes. However, a contact structure is also possible which has external contacts arranged directly above the blind holes, in particular solderable metallic areas that are in electrically conductive contact with the corresponding metallic structures. In all embodiments, the carrier layer serves as an electrically insulating interlayer between the metallic structures and the contact structure and also as a carrier of the contact structures. In addition, the carrier layer can consist of a material having a sufficient hermeticity.

In one embodiment, the UV-curable resist layer is applied to the carrier layer over the whole area. The carrier layer is subsequently placed on the metallic structures such that at least one portion of the metallic structures penetrates through the resist layer as far as the contact with the surface of the carrier layer. For the case where all the metallic structures have the same height, all the metallic structures are introduced into the resist layer until they come into contact with the surface of the carrier layer.

The resist layer is subsequently cured by means of UV irradiation. After the resist layer has been cured, the carrier layer is stripped away from the resist layer. A cavity remains in which the component structures enclosed by the frame structure are enclosed between resist layer and wafer.

In the next step, a structured contact structure is applied to that surface of the resist layer which faces away from the wafer such that it is electrically conductively connected to the metallic structures that penetrate through the resist layer and are therefore exposed.

This embodiment has the advantage that no blind holes are required for contacting purposes, since the surfaces of the metallic structures are exposed on the resist layer. If appropriate, a uniform layer removing step can be carried out to remove a remaining residual layer thickness between the metallic structures and the outwardly facing surface of the resist layer. By way of example, a short plasma treatment suitable for etching the resist can be carried out for this purpose. By way of example, an oxygen plasma can be used.

In a further embodiment, a whole-area resist layer is not used. Rather, a resist layer is selectively applied to the surfaces of the metallic structures. A carrier layer is subsequently adhesively bonded onto said metallic structures provided with the resist layer, wherein the resist layer is used as an adhesive.

Since the resist layer is suitable here for adhesive bonding rather than for sealing the cavity, the carrier layer remains on the arrangement. In the next step, therefore, here as well blind holes are produced and the surfaces of the metallic structures are exposed therein. Afterward, a structured contact structure is applied to that surface of the carrier layer which faces away from the wafer such that an electrically conductive contact of the contact structure with the metallic structures exposed in the blind holes is produced.

In this embodiment, during the production of the blind holes, by complying with the lateral tolerance it is possible to ensure that the structure widths of the blind holes are less than the structure widths of the metallic structures and the cavity enclosed between carrier layer and wafer thus need not be opened.

If a method for monitoring the etching depth for the blind holes is available, the above-described variant with the different heights of the metallic structures can be carried out with greater lateral tolerance. In this case, however, care should be taken to ensure that the depth of the blind holes does not exceed the layer thickness of the resist layer, in order here as well to avoid an opening of the cavity between resist layer and wafer.

The last-mentioned method variant has the advantage that although a high lateral structure accuracy is required during the production of the blind holes, the method is controllable in a simple manner with regard to the depth of the blind holes, since the surfaces of the metallic structures can serve as a stop or as an etching stop.

In all the method variants, a trench pattern can be produced in the active surface of the wafer before connection to the resist layer and the carrier layer such that a multiplicity of component regions are separated from one another as a result. The component structures assigned to a respective component are arranged in each component region. Resist and carrier layers are subsequently applied and the resist layer is cured.

At an arbitrary stage after this method step, the wafer can subsequently be thinned from the rear side until the trench pattern is exposed. This has the effect that each component region has a substrate portion completely separated from the other component regions.

Besides the separation into individual substrates, the wafer thinning has the advantage that the total height of the component is reduced, wherein the composite assembly comprising the resist layer and the carrier layer ensures that the components is nevertheless sufficiently mechanically stable and is therefore stable to withstand both damage and deformation. The thinning of the wafer is preferably carried out by means of a mechanical method, for example by means of a grinding or milling process.

In a further method variant, the wafer or the separated individual substrates is or are sealed relative to the carrier layer or relative to the resist layer from the rear side by means of a hermetic layer. The hermetic layer is therefore applied at least to the rear side of the wafer and to the surface of the carrier layer or of the exposed resist layer.

In one method variant, an anisotropic deposition of the hermetic layer also leads to an edge covering, such that the hermetic layer continuously covers the rear sides and side surfaces of all the components.

In one method variant, the hermetic layer can also be applied only at the locations at which the hermeticity of the existing housing has to be reinforced. These locations are, in particular, the surface and other exposed interfaces of the resist layer with respect to the frame structure and with respect to the carrier layer. In this case, a method which can produce a structured hermetic layer positionally accurately is used for producing the hermetic layer. A nanojet method, in particular, is suitable for this embodiment, wherein preferably metallic inks are applied by printing/jetting. However, it is also possible for the hermetic layer to be applied by sputtering or printing using a different method. Optionally, the applied structures or the layer applied over the whole area can subsequently also be reinforced by electrolytic or electroless metal deposition. The different methods for producing the hermetic layer can also be combined.

A better hermetic sealing by the hermetic layer is achieved if previously exposed surfaces of the resist layer are substantially removed. This can be carried out at a method stage after the trench pattern has been exposed by wafer thinning. By means of a suitable etching method, through the opened trench pattern, the surface of the carrier layer can then be freed of the resist layer situated there. In this case, the method can be set such that the regions of the resist layer which function as adhesive between the metallic structures and the carrier layer are left undamaged by the etching method. By way of example, an oxygen-containing plasma is suitable for etching the cured resist.

The UV-curable resist layer can be cured by means of UV irradiation through the carrier layer in a simple manner if a carrier layer that is transparent to UV radiation is used.

However, it is also possible additionally or alternatively to use a wafer that is transparent to UV radiation. For components that operate with acoustic waves, piezo-substrates are suitable for this purpose, which are generally likewise transmissive to UV radiation. For the variant with a carrier layer, a thermally curing resist can also be used, wherein the wafer is then brought to a correspondingly elevated temperature in its entirety, e.g., in a furnace. However, it is also possible to place the arrangement with the carrier layer onto a heating plate in order to bring about heating only locally.

The carrier layer can be an arbitrary thin film. It can consist of glass or comprise a glass layer. It can be a plastic film. It can be a composite film comprising at least one plastic layer and one metal layer. In one embodiment layer, the carrier layer is provided with a metal lamination, for example with a copper lamination, and comprises a plastic film. A contact structure can be produced from such a metal-laminated carrier layer in a simple manner by means of etching structuring. Said contact structure can be reinforced after structuring by metallic deposition, if appropriate. It is also possible to apply a resist to the metal-laminated surface, to structure it and then to reinforce the layer in the exposed regions. After the removal of the resist, the residual thin lamination remaining can be removed by etching. In this case, the blind holes can be opened before or after the structuring of the metal lamination. In both cases, however, it must then be ensured that an electrically conductive contact is produced between metallic structures in the blind holes and the metal lamination. This can be carried out for example by filling the blind holes with electrically conductive material.

In the last step, the components are singulated by the carrier layer and/or the resist layer being severed between the individual components. This is preferably carried out by means of a sawing step. However, it is also possible to perform the separation into individual components by means of a laser method.

BRIEF DESCRIPTION OF THE DRAWINGS

The invention is explained in greater detail below on the basis of exemplary embodiments and the associated figures. The figures have been drawn up merely schematically and serve solely for affording a better understanding of the invention. Individual parts may therefore be illustrated with enlarged or reduced size. Therefore, neither absolute nor relative dimensional indications can be inferred from the figures.

In the figures.

DETAILED DESCRIPTION OF ILLUSTRATIVE EMBODIMENTS

Figure 1:
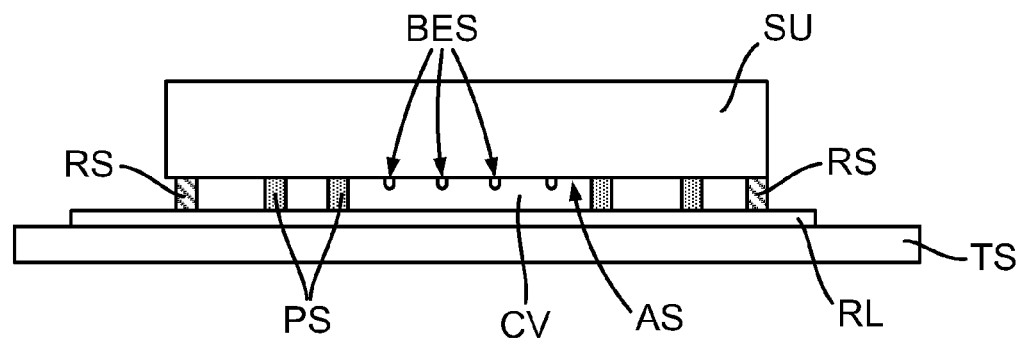
FIG. 1 shows a MEMS component during one method stage after connection to a carrier layer in schematic cross section.

FIG. 1 shows in schematic cross section an individual substrate for a MEMS component at a stage in which the substrate SU is connected to the carrier layer TS with the aid of a resist layer RL. The substrate SU has component structures BES on its active surface AS. The component structures additionally comprise contact areas (not illustrated in the figure) on which metallic column structures PS are seated. Furthermore, a frame structure RS, preferably composed of the same material as the column structures PS, is applied on the active surface AS. The frame structure encloses at least the active component structures BES on the surface. The contact areas and column structures are also arranged within the frame structure RS. However, it is also possible to arrange individual ones of the contact areas and of the column structures PS seated thereon outside the frame structure on the active surface AS.

With the metallic structures, namely the metallic frame structure RS and the metallic column structures PS, the substrate SU is seated on a resist layer RL arranged on a carrier layer TS. In this case, it is at least ensured that the cavity CV within the frame structure RS between substrate SU and carrier layer TS is totally sealed. This presupposes that the metallic structures at least dip into the resist layer RL. The resist layer is preferably a UV-curable resist layer. The thickness of the resist layer is chosen to be smaller than the height difference between the component structures the highest column structures.

The metallic structures can penetrate into the resist layer RL to a depth such that they come into contact with the surface of the carrier layer TS.

Figure 2:
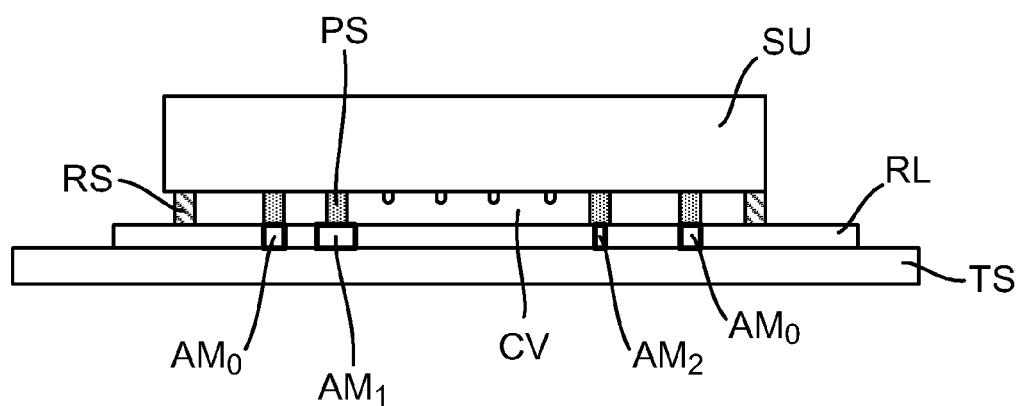
FIG. 2 shows a MEMS component at the same stage in one method variant.

FIG. 2 shows such an embodiment in which only a portion of the metallic structures have penetrated into the resist layer RL as it were to a stop at the carrier layer. Such a differentiation between the metallic structures is achieved by virtue of the more deeply penetrating metallic structures being thickened with an additional metal ply AM, which can be structured differently in comparison with the lower first metal ply. In a manner illustrated in combined fashion in a single illustration, FIG. 2 shows, e.g., further metal plies AM0 having the same cross section as the underlying first metal ply. Furthermore, it is possible to choose the cross section of the further metal ply within a column structure to be larger than the cross section of the first metal ply, as is illustrated for the further metal plies AM1. In a third variant, the cross section of the further metal ply AM2 can have a smaller cross-sectional area than the underlying first metal ply of the respective column structure PS.

A widened second metal ply AM1 has the advantage that it ensures an increased method reliability during the later contacting through the carrier layer TS. A narrowed second metal ply AM2 has the advantage that it can be sunk into the resist layer R11 more easily. The metallic structures which are not thickened with a second metal ply AM and therefore have a smaller height than the thickened metallic structures cannot penetrate as far as the surface of the carrier layer TS. In particular, metallic structures which are not provided for electrical contacting can remain without a second metal ply.

Figure 3A:
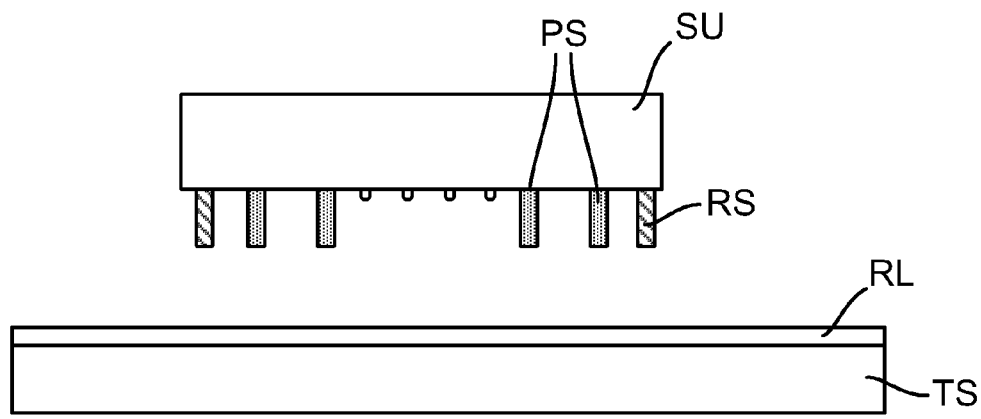
FIGS. 3A to 3C show different method stages during the production of an alternative embodiment.
Figure 3B:
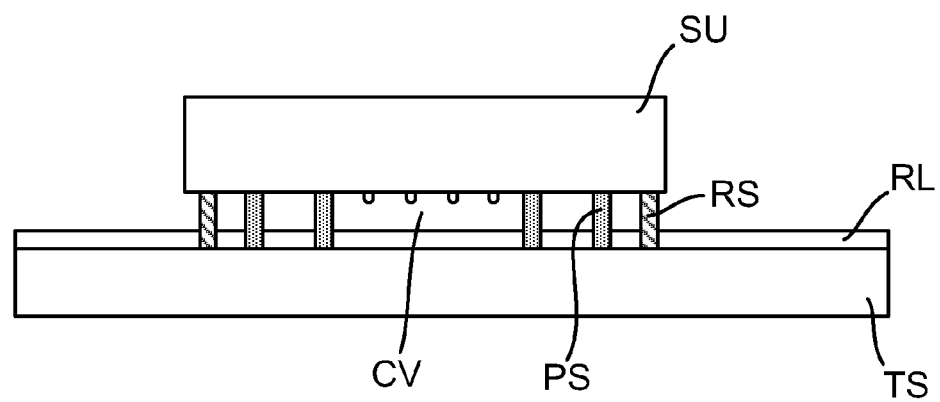
Figure 3C:
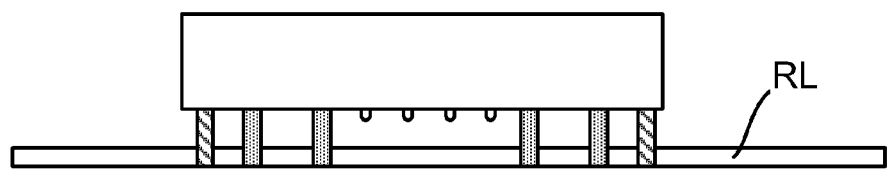

FIGS. 3A to 3C show different method stages during the production of a MEMS component in accordance with a further variant or embodiment, which manages without a carrier layer TS in the end product. FIG. 3A shows a carrier substrate TS coated with a resist layer RL, and a substrate SU having component structures, a frame structure RS and column structures PS. The metallic structures can have identical or different heights. It is advantageous if the surfaces of the metallic structures are brought to the same level with the aid of a planarization process, for example, by milling away or grinding away, such that their surfaces lie within one plane and can thus be better covered tightly with a planar carrier layer TS.

FIG. 3B shows the emplaced substrate SU, wherein the metallic structures have penetrated into the resist layer RL as far as the surface of the carrier layer TS. Afterward, the resist layer RL is cured and preferably irradiated with UV light for this purpose.

After the resist layer has been cured in this way to form a UV-cured resist, the impermeability of the cavity CV is ensured, as is the mechanical stability thereof. It is then possible to strip the carrier layer TS away from the cured resist layer, such that only the cured resist layer RL remains at the component. The top sides of the metallic structures terminate flush with that surface of the resist layer RL which faces away from the substrate, that is to say that they are exposed and can thus be contacted in a simple manner. FIG. 3C shows the arrangement in this method stage.

A residual layer thickness of the resist layer RL which is possibly still present over the ends of the metallic structures can be removed in an additional method step mechanically, chemically or in some other way, for example, by plasma etching.

Figure 4A:
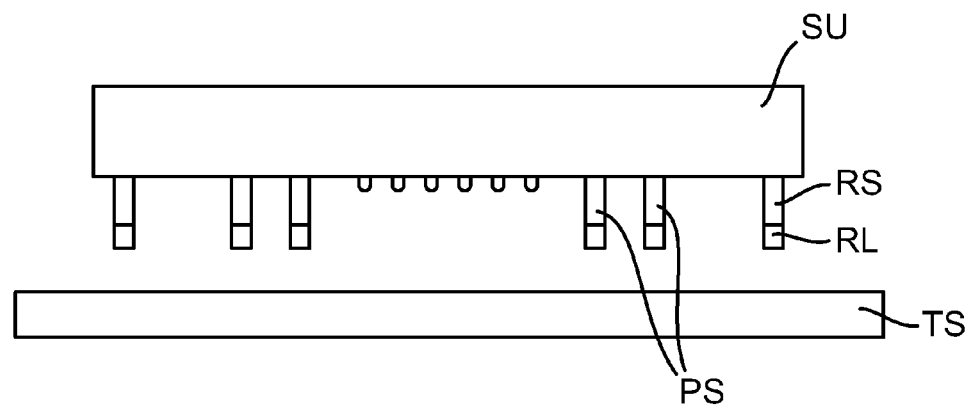
FIGS. 4A and 4B show two method stages during the production of a MEMS component of a further embodiment.
Figure 4B:
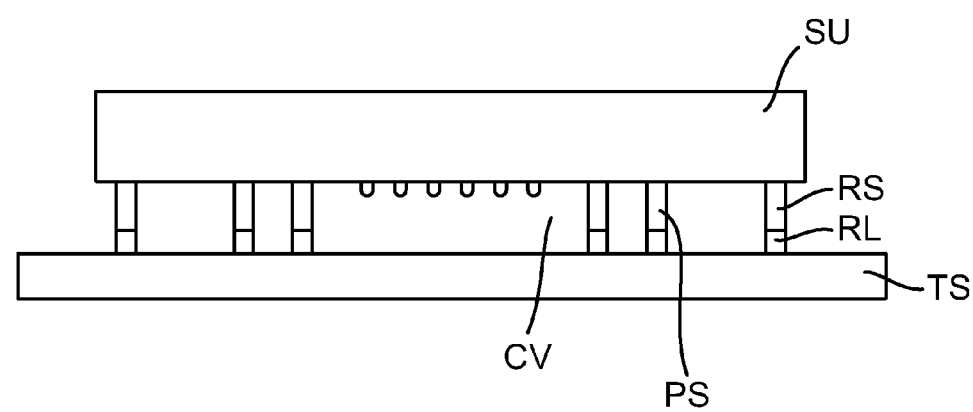

FIGS. 4A and 4B show two method stages during the production of a component in accordance with a further variant. In contrast to the variants according to FIGS. 1 to 3, here the resist layer RL is not applied as a whole-area layer on the carrier substrate TS, but rather in accordance with FIG. 4A selectively only on those ends of the metallic structures which face away from the substrate. This is accomplished by means of a suitable method, for example, by means of an, e.g., UV-curable resist being applied by printing, spreading or rolling.

FIG. 4B shows the arrangement after the metallic structures covered with the resist layer RL have been placed onto the carrier layer TS. In this way, too, the cavity CV can be tightly closed off. For this method variant, however, it is advantageous to bring all the ends of the metallic structures to the same level by means of the abovementioned planarization method, in order more reliably to ensure the impermeability of the cavity CV.

FIGS. 1 to 4 illustrate the components in method stages before a structured metallization for producing external contacts and for making contact with the active component structures BES is applied. In all these embodiments, the minimum layer thickness of the resist layer RL is chosen such that the cavity CV can be tightly closed off, which overall is additionally a question of the structure accuracy and the planarity both of the metallic structures and of the carrier layer TS. The embodiment wherein the carrier layer TS is removed additionally requires a higher layer thickness of the resist layer RL, since the latter is used as a self-supporting component covering or as a housing cover and in this case must ensure the mechanical stability of the covering. A typical layer thickness for a variant according to FIG. 2 is 1 µm, for example. A suitable layer thickness for the variant according to FIG. 3 is 10 µm, for example. Under the abovementioned prerequisites of the method reliability, the impermeability of the cavity and the good adhesion, a suitable layer thickness can, however, deviate from these values upward or downward.

FIGS. 1 to 4 illustrate the component and the method leading thereto on the basis of an individual component substrate and the corresponding section of the carrier layer TS, but said method is generally carried out simultaneously at the wafer level for all components situated on a wafer.

FIGS. 5A to 5D show further details during production at the wafer level. A wafer serving as substrate SU comprises active component structures for a multiplicity of components. Active component structures and metallic structures of a respective component are arranged within a component region BB, of which the wafer serving as substrate SU has a multiplicity. A trench pattern GM introduced into the active surface comprises trenches enclosing each individual component region BB along the later separation line in the singulation of the components. The trench pattern can be introduced into the substrate SU to approximately 50% of the layer thickness. The minimum depth of the trench pattern GM corresponds to the final layer thickness of the substrate provided for the later component after thinning.

Figure 5A:
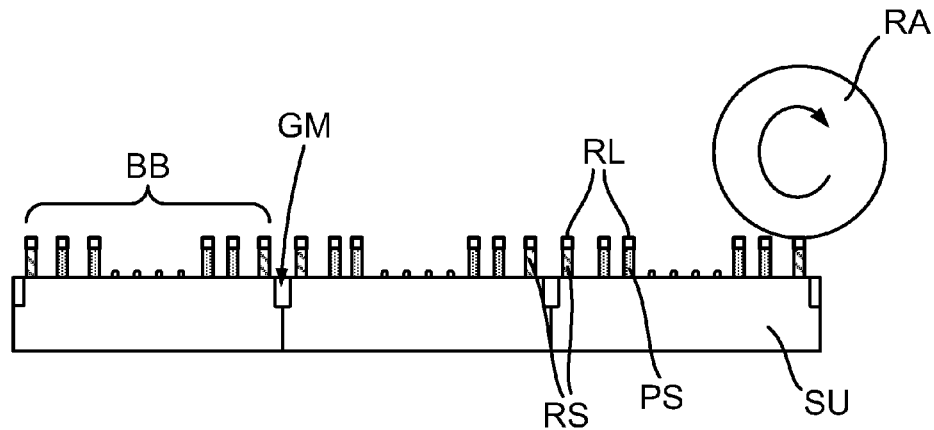
FIGS. 5A to 5D show different method stages of a further method variant on the basis of schematic cross sections.

The metallic structures are preferably leveled by means of the abovementioned planarization method, such that a resist layer can be applied to the upper ends of the metallic structures in a simple manner by means of a printing method. A resist layer applying device RA therefore comprises a roller, for example, which can be used for roller coating. The resist is applied to the surface of a roller and rolled onto the metallic structures. FIG. 5A shows the arrangement during the application of the resist layer RL.

In the next step, the carrier layer TS is placed onto the metallic structures coated with resist. For this purpose, a thin and flexible film is preferably used, which be a plastic film, a composite film comprising plastic and a further material, in particular inorganic material, or a purely inorganic film and consist of glass, for example. Hermetic materials, for example glass, are preferred.

Figure 5B:
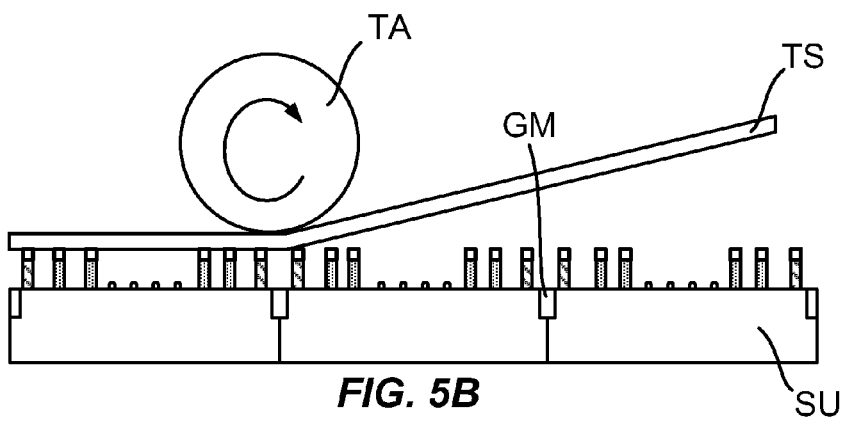

The flexible carrier layer TS or the film used therefor is then rolled or laminated onto the metallic structures of the entire wafer with the aid of a carrier layer applying device TA. Suitable pressure ensures a reliable connection of carrier layer TS and metallic structures that guarantees a reliable closure of the cavity. FIG. 5B shows the arrangement during the application of the carrier layer TS.

Figure 5C:
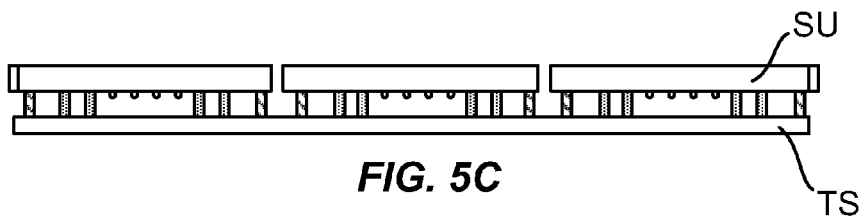
Figure 5D:
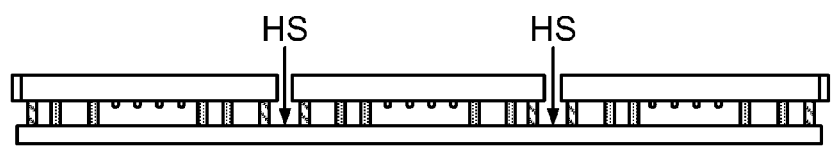

In the next step, the layer thickness of the wafer serving as substrate SU is reduced from the rear side. This can be carried out by means of grinding away, for example. The thinning is carried out until the trench pattern is exposed from the rear side of the substrate SU. In this way, the individual substrates are separated from one another, such that each component region BB has a substrate mechanically separated from adjacent components. FIG. 5C shows the arrangement at this method stage, wherein, however, in contrast to FIGS. 5A and 5B, now the substrates are illustrated facing upward.

If a hermetic carrier substrate TS is used, then in a further method stage the hermeticity of the components can be increased further by virtue of the separating joints between the metallic structures, in particular the frame structure, and the carrier layer being covered with a hermetic layer. For this purpose, through the trench pattern, or the gaps existing between the individual component regions BB, hermetic material is thus applied to the exposed surfaces of the carrier layer, of the resist layer and at least portions of the frame structure. This can be carried out by means of an isotropic application method that is suitable for producing a layer also at vertical or overhanging surfaces. However, it is also possible to use a structuring anisotropic method, for example, a jet printing method. This makes it possible to produce even fine structures of the printed material at the desired location. The application of the hermetic layer HS is indicated by arrows in FIG. 5D.

Inorganic layers, in particular metallic layers, serve as the hermetic layer. The jet printing method can also be used to print inks which comprise metallic particles and which can be converted into continuous and impermeable metallic coatings. Inks which comprise metallic nanoparticles can be melted at particularly low temperatures and converted into continuous metal layers or metal structures. Such inks comprise silver nanoparticles, in particular.

A hermetic layer HS applied in a structured fashion or applied by sputtering over the whole area can additionally be reinforced by an electrolytic or electroless metal deposition method and the impermeability of said hermetic layer can thereby be increased. A hermetic layer HS also applied to the rear sides of the substrates over the whole area can additionally exhibit a shielding action against electromagnetic radiation.

Figure 6A:
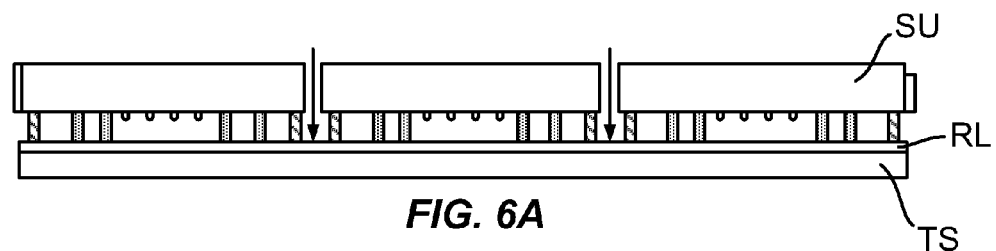
FIGS. 6A to 6C show a measure for hermetic sealing on the basis of different method stages during the production of a MEMS component.
Figure 6B:
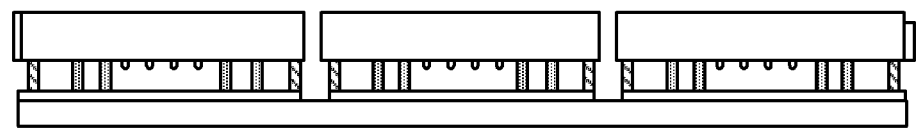

Through the gaps between the individual substrates, regions of the resist layer RL that are exposed there can be removed by means of etching. This is indicated by arrows in FIG. 6A. FIG. 6B shows the arrangement after the removal of the resist layer RL between the individual components, such that the surface of the carrier layer TS is exposed there.

Figure 6C:
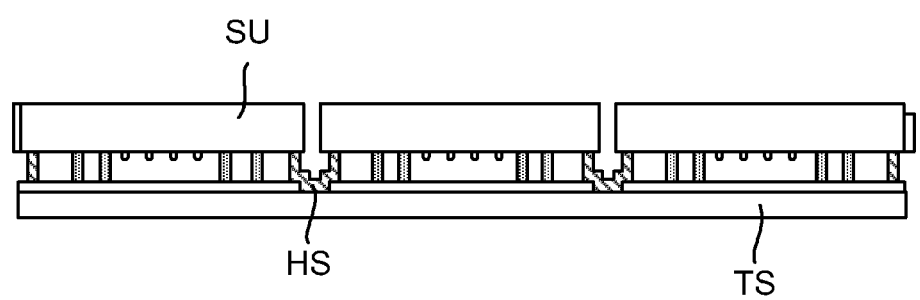

In these regions, a hermetic layer is then deposited, as described above with reference to FIG. 5. This can be carried out selectively in the region between the substrates, as illustrated in FIG. 6C, or else alternatively over the whole area over the entire arrangement and the rear sides of the substrates SU.

Figure 7A:
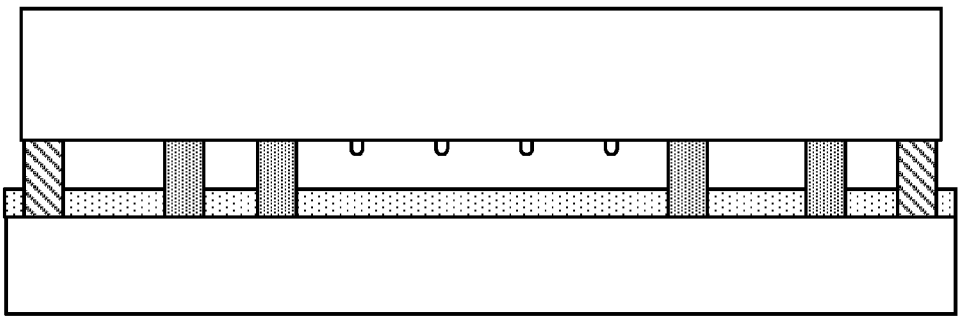
FIGS. 7A to 7C show the production of a structured metallization and of a passivation layer on the basis of different method stages.
Figure 7B:
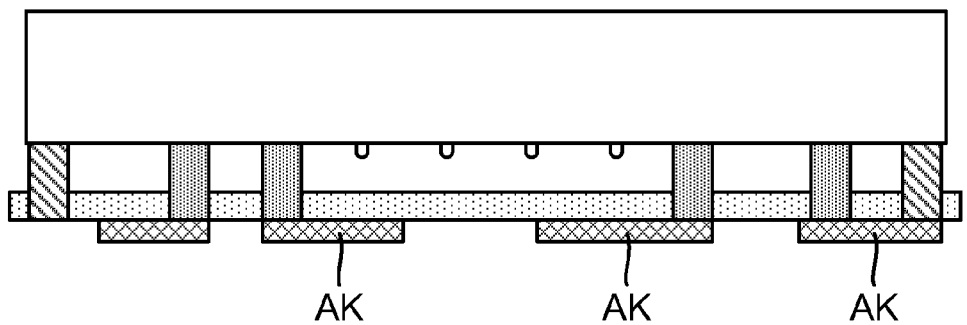
Figure 7C:
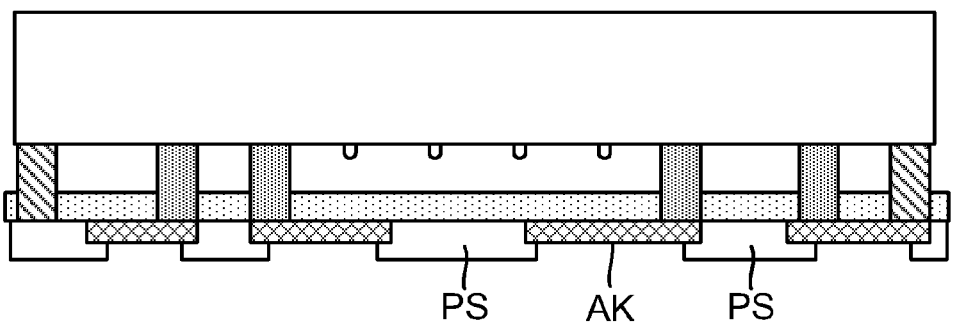

FIGS. 7A to 7C show different method stages during the production of a structured metallization on that surface of the covering which faces away from the substrate, said covering here being illustrated as a pure resist layer RS in accordance with the method variant according to FIG. 3. FIG. 7A shows the component after placement onto the carrier layer covered with a resist layer over the whole area, in such a way that the ends of the metallic structures completely penetrate through the resist layer and are practically in contact with the carrier layer TS. After the resist layer has been cured and the carrier layer has been stripped away, the surfaces of the metallic structures are therefore exposed at the outwardly facing surface of the resist layer RL. By applying a structured metallization, it is then possible to produce connecting lines and external contacts HK. Metallization and structuring methods known per se are suitable for this purpose. In a simple manner, such contacts can, for example, be applied by printing and, if appropriate, reinforced by metal deposition. However, a two-stage metallization with the aid of a metallic growth layer applied by sputtering and subsequent electrolytic or electroless reinforcement is also possible. FIG. 7B shows the arrangement at this method stage.

In the next step, that surface of the resist layer RL which is provided with external contacts AK can also be provided with a passivation layer PS. Such a passivation layer is preferably produced from inorganic material, in particular an oxidic, nitridic or other hard and impermeable material. The passivation layer PS is structured such that it covers exposed regions of the resist layer and of the edges of the external contacts and only leaves free that region of the external contacts which is utilized for contacting purposes. FIG. 7C shows the arrangement with the applied and structured passivation layer PS. The external contacts can be produced in the form of a ball grid array or a land grid array in a manner known per se.

Figure 8A:
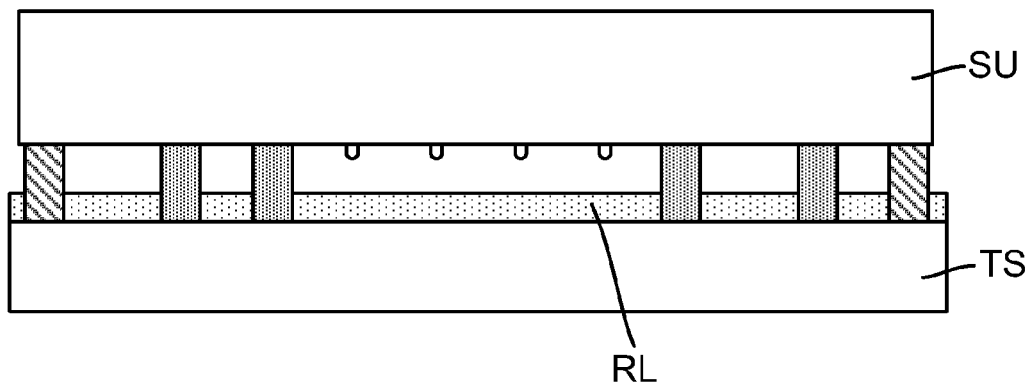
FIGS. 8A to 8C show different method stages during the production of a structured metallization.
Figure 8B:
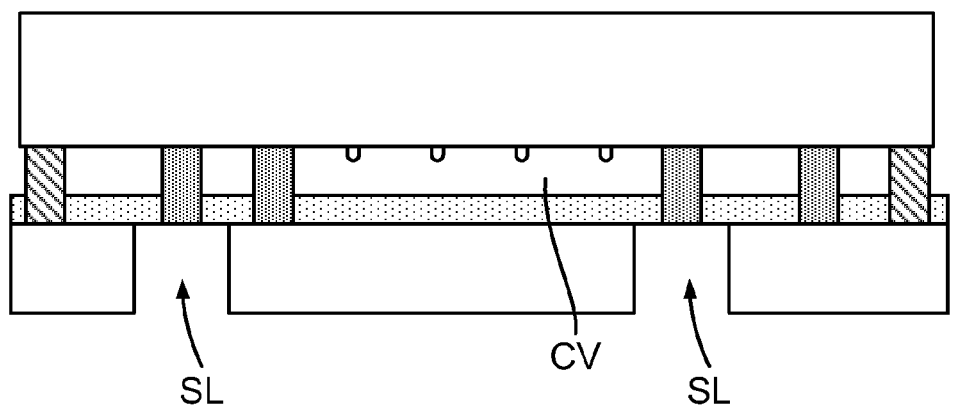
Figure 8C:
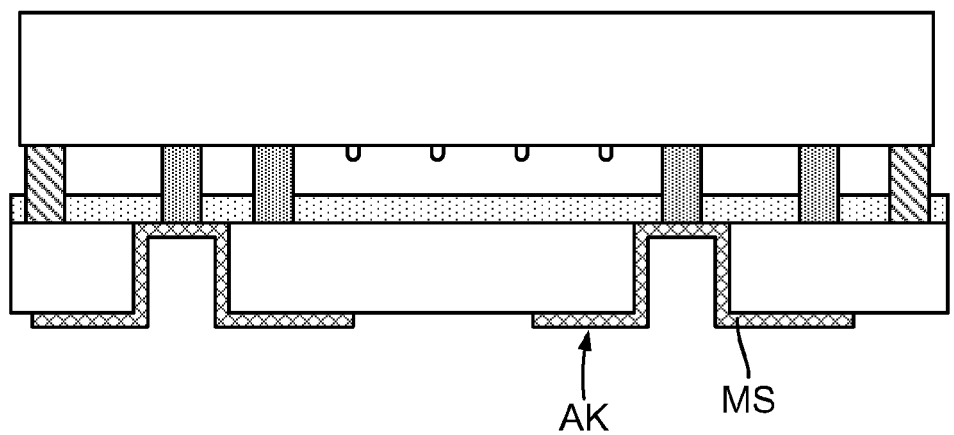

FIGS. 8A to 8C show different method stages during the production of a structured metallization on the outwardly facing underside of the carrier layer TS. FIG. 8A shows the arrangement after a carrier layer TS covered with a resist layer RL has been placed onto the metallic structures of the component substrate SU. After curing by means of UV light and conversion into a UV-cured resist layer RL, blind holes SL are produced from the underside of the carrier layer, in which blind holes the surface of the metallic structures to be contacted are exposed. The blind holes are produced such that the enclosed cavity CV remains closed, that is to say that the resist layer RL is not penetrated by the blind hole. Various measures are suitable for this purpose.

By way of example, it is possible to monitor the layer depth. A further measure comprises end point identification, wherein the beginning of the removal of the metallic structure is identified. A further possibility consists in centering the cross-sectional area of the blind hole SL in each case on the metallic structure to be contacted, and in making the cross-sectional area of the blind hole smaller than the cross section of the metallic structure, such that the base of the blind hole SL is formed completely by the metallic structure. In this way, the metal of the metallic structure constitutes a "natural" etching stop.

A suitable method for producing the blind holes SL can be chosen depending on the material of the carrier layer TS. If the carrier layer TS has a sufficiently thin layer thickness, the blind holes SL can be produced with the aid of a laser. This has the advantage that the laser can be used positionally accurately and an additional resist mask is not required. Also suitable are dry or wet etching methods which must can be carried out using a corresponding resist mask that is applied on the underside of the carrier layer TS and is structured.

In the next step, a structured metallization MS is produced such that it can be electrically conductively connected to the metallic structures exposed in the blind holes. For this purpose, as illustrated in FIG. 8C, for example, an electrically conductive material, in particular a metal, is deposited preferably over the whole area, for example, by sputtering, such that it is in contact with the metallic structure at the base of the blind holes. This is followed by structuring and, if appropriate, reinforcement of the metal layer in a metal deposition method, which can be carried out electrolytically or in an electroless fashion. The structuring can be carried out by applying a structured resist mask to the metal layer applied over the whole area, such that the thickening takes place only in the regions remaining free of the resist mask. Afterward, the mask is removed and the residues of the metal layer in the non-reinforced regions are removed. FIG. 8C shows the arrangement in this method stage.

Figure 9A:
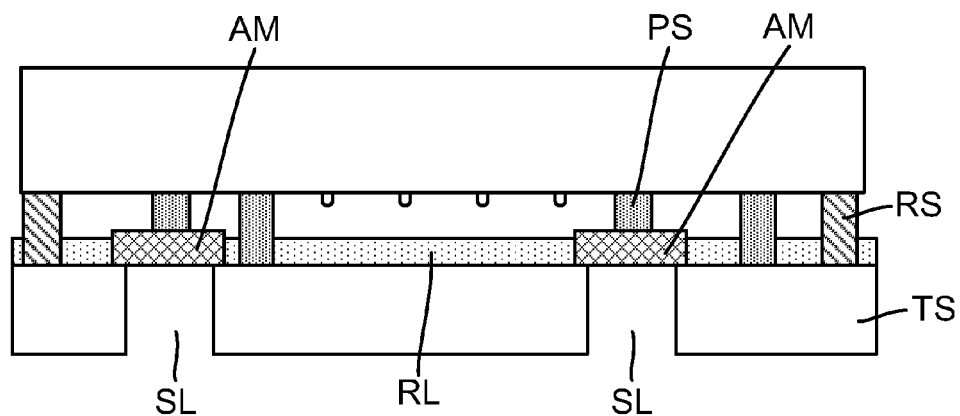
FIGS. 9A and 9B show two method stages during the production of one variant of a metallization structure.
Figure 9B:
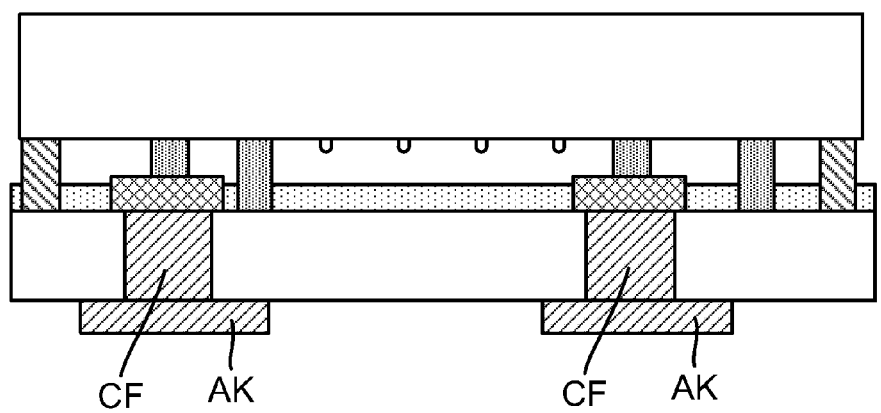

However, it is also possible, after the method stage illustrated in FIG. 8B (after the production of the blind holes SL), firstly to provide the blind holes with an electrically conductive filling, as is illustrated in FIG. 9B, for instance. This can be carried out by means of a mechanical method, e.g., by introducing a conductive paste. Afterward, the structured metallization can be implemented in a layer deposition method on the carrier layer TS, which is now approximately planar because it is provided with filled blind holes SL.

However, it is also possible to apply the structured metallization by means of a printing method which can be performed such that it leads to the contacting of the metallic structures including in the base of the blind holes.

FIG. 9A shows one variant of the method described with reference to FIGS. 8A to C, wherein the metallic structures are embodied with a cross section that varies over the height. In the embodiment illustrated, at least in the case of a portion of the metallic structures RS, PS, the upper end remote from the substrate is provided with a larger cross-sectional area, which is then pressed into the resist layer RL as far as the contact with the carrier layer TS upon placement of the substrate. The enlarged cross-sectional area of the metallic structures has the effect that more area is available for producing the blind holes, without the enclosed cavity being opened as a result. A blind hole reliably centered on the widened cross section of the metallic structures leads to high method reliability.

The cross-sectional area of the metallic structures can be varied during the production of the metallic structures in a step between first and second metal plies. In the present example, the further metal ply AM1 is produced above specific metallic column structures PS to be contacted with a larger cross-sectional area than the first metal ply.

FIG. 9B shows a structured metallization wherein the blind hole SL is closed with an electrically conductive compound CF. The structured metallization then comprises the electrically conductively filled blind hole and a metallization applied on the underside of the carrier layer over the filled blind holes, said metallization realizing external contacts AK.

Figure 10:
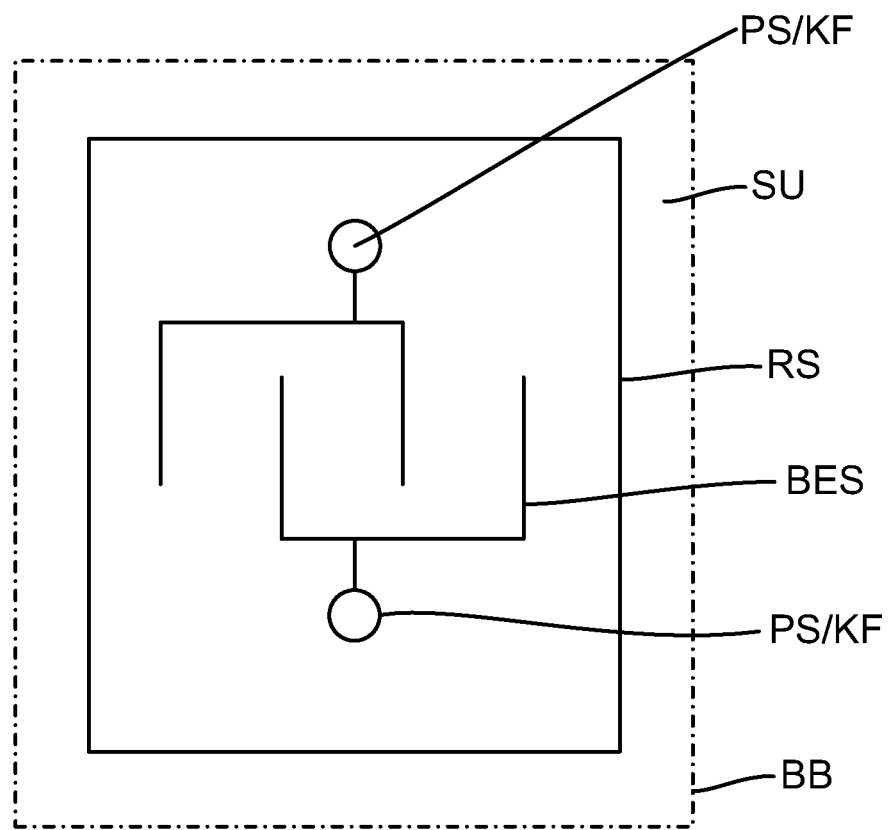
FIG. 10 shows a plan view of the active surface of a substrate with active component structures, contact areas and frame structure.

FIG. 10 shows in plan view a substrate with component structures BES, contact areas KF connected thereto, or with metallic column structures PS seated thereon and with a frame structure RS enclosing the component structures. A dash-dotted line denotes the substrate edge, or the boundary of the component region BB which can be formed together with a plurality of further component regions and the associated structures on a common wafer. An interdigital transducer such as is used as a frequency-determining structure in SAW components, for example, is illustrated in a representative manner for the component structures BES. The component structures BES can also comprise further structures or further interdigital transducers besides the interdigital transducer. Other types of electrical or electromechanical components can also have component structures deviating therefrom, for example, a movable membrane in a capacitive MEMS component.

The frame structure RS encloses the component structures BES. In a departure therefrom, however, the contact areas KF can be led, by means of a lead running below the frame structure RS, into a region outside the region enclosed by the frame structure RS. Since neither contact area nor metallic column structure constitutes a mechanically sensitive structure, these also need not be arranged in the cavity enclosed by the frame structure RS in the finished component.

Insofar as only individual components have been illustrated in the embodiments illustrated and described above, it is nevertheless clear that all the method steps are preferably carried out at the wafer level. The invention has been illustrated in part on the basis of only an individual substrate for a single component merely for the sake of simplicity. Individual structures illustrated in the figures can also be used in other embodiments, even if they are not explicitly mentioned or illustrated therein. In this regard, it is possible, for example, to provide in all embodiments a hermetic layer which covers at least the side surfaces of the component and closes them off relative to the carrier layer TS. The hermetic layer HS can also cover the entire rear side of the substrate SU. Furthermore, the hermetic layer can be electrically conductively connected to an external contact AK on the underside of the carrier layer TS via a correspondingly positioned contact hole.

It is also possible in all cases to make electrical contact with the frame structure RS, preferably to connect it to a grounded external contact AK. With the aid of this additional ground connection, an improved shielding of the component is achieved, which provides for interference-free operation of the component.

If individual method step have been described on the basis of specific methods known per se, the method is nevertheless not restricted to this expressly mentioned means, provided that other methods having an identical action are known and can be used.

For all components together with encapsulation manufactured at the wafer level, it holds true that they generally have to be singulated by the severing of the carrier layer in a final or in one of the final steps. Furthermore, it is possible for the individual components, as early at the wafer level, to be covered with a mechanically stable potting compound in addition or as an alternative to the hermetic layer, in order to facilitate secure handling of the component. A potting compound applied at the wafer level requires a separate singulation step in order to sever the not inconsiderable layer thickness of the potting compound in the region of the separation lines separating the component regions BB.

The invention is not restricted to the exemplary embodiments described and illustrated in the figures. Rather, all novel features and feature combinations in particular of features mentioned in the claims should be regarded as associated with the invention.

The invention claimed is:

1. A Microelectromechanical Systems (MEMS) component comprising:
   a substrate having an active surface, wherein electrical component structures and contact areas for making electrical contact with the electrical component structures are arranged on the substrate;
   metallic column structures located on the contact areas and projecting beyond the electrical component structures;
   a metallic frame structure arranged on the active surface of the substrate and enclosing the electrical component structures together with the metallic column structures;
   a resist layer seated on the metallic frame structure and the metallic column structures such that the substrate, the metallic frame structure and the resist layer form an enclosed cavity, wherein at least one portion of selected metallic column structures and the metallic frame structure penetrates through the resist layer to an extent such that those surfaces of the metallic column structures that face away from the substrate are not covered by the resist layer; and
   a structured metallization arranged over a surface of the resist layer that faces away from the substrate, wherein the structured metallization forms at least structured external contacts for making contact for the MEMS component and are electrically conductively connected to the surfaces of the metallic column structures not covered by the resist layer.

2. The MEMS component according to claim 1, further comprising a further carrier layer arranged on the resist layer, the structured metallization being arranged on the further carrier layer.

3. The MEMS component according to claim 1,
   wherein a carrier layer is arranged above the resist layer;
   wherein the structured external contacts are arranged on the surface of the carrier layer; and
   wherein plated-through holes through the carrier layer are provided that connect the external contacts to the metallic column structures.

4. The MEMS component according to claim 3, wherein a hermetic layer seals a rear side of the substrate, the rear side being located opposite the active surface, relative to the carrier layer.

5. The MEMS component according to claim 4,
   wherein the substrate is a piezoelectric wafer;
   wherein the electrical component structures comprise an interdigital transducer;
   wherein the carrier layer is a glass film; and
   wherein the hermetic layer is a metallic layer.

6. A Microelectromechanical Systems (MEMS) component comprising:
   a substrate having an active surface with electrical component structures and contact areas;
   metallic column structures located on the contact areas;
   a metallic frame structure arranged on the active surface of the substrate and enclosing the electrical component structures and the metallic column structures;
   a resist layer seated on the metallic frame structure and the metallic column structures such that the substrate, the metallic frame structure and the resist layer form an enclosed cavity, wherein selected ones of the metallic column structures penetrate through the resist layer such that surfaces of the selected metallic column structures that face away from the substrate are not covered by the resist layer; and
   a structured metallization arranged over a surface of the resist layer that faces away from the substrate, wherein the structured metallization forms at least structured external contacts for making contact for the MEMS component and is electrically conductively connected to the surfaces of the metallic column structures.

7. The MEMS component according to claim 6, further comprising a carrier layer arranged on the resist layer, the structured metallization being arranged on the carrier layer.

8. The MEMS component according to claim 7,
wherein the substrate is a piezoelectric wafer,
wherein the electrical component structures comprise an interdigital transducer, and
wherein the carrier layer is a glass film.

9. The MEMS component according to claim 6, further comprising:
a carrier layer arranged on the resist layer;
structured external contacts arranged on the surface of the carrier layer; and
through holes located in the carrier layer such that the through holes connect the external contacts to the metallic column structures.

10. The MEMS component according to claim 9, further comprising a hermetic layer, wherein the hermetic layer seals a rear side of the substrate, the rear side being located opposite to the active surface.

11. The MEMS component according to claim 10,
wherein the substrate is a piezoelectric wafer,
wherein the electrical component structures comprise an interdigital transducer,
wherein the carrier layer is a glass film, and
wherein the hermetic layer is a metallic layer.

12. The MEMS component according to claim 6, further comprising a hermetic layer, wherein the hermetic layer seals a rear side of the substrate, the rear side being located opposite to the active surface.

13. A Microelectromechanical Systems (MEMS) component comprising:
a substrate having an active surface with electrical component structures and contact areas;
metallic column structures located on the contact areas;
a metallic frame structure arranged on the active surface of the substrate and enclosing the electrical component structures and the metallic column structures;
a resist layer seated on the metallic frame structure and the metallic column structures such that the substrate, the metallic frame structure and the resist layer form an enclosed cavity, wherein the resist layer has an interface with the enclosed cavity; and
a structured metallization arranged over a surface of the resist layer that faces away from the substrate, wherein the structured metallization forms at least structured external contacts for making contact for the MEMS component and is electrically conductively connected to the metallic column structures.

14. The MEMS component according to claim 13, further comprising a carrier layer arranged on the resist layer, the structured metallization being arranged on the carrier layer.

15. The MEMS component according to claim 14,
wherein the substrate is a piezoelectric wafer,
wherein the electrical component structures comprise an interdigital transducer, and
wherein the carrier layer is a glass film.

16. The MEMS component according to claim 13, further comprising:
a carrier layer arranged on the resist layer;
structured external contacts arranged on the surface of the carrier layer; and
through holes located in the carrier layer such that the through holes connect the external contacts to the metallic column structures.

17. The MEMS component according to claim 16, further comprising a hermetic layer, wherein the hermetic layer seals a rear side of the substrate, the rear side being located opposite to the active surface.

18. The MEMS component according to claim 17,
wherein the substrate is a piezoelectric wafer,
wherein the electrical component structures comprise an interdigital transducer,
wherein the carrier layer is a glass film, and
wherein the hermetic layer is a metallic layer.

19. The MEMS component according to claim 13, further comprising a hermetic layer, wherein the hermetic layer seals a rear side of the substrate, the rear side being located opposite to the active surface.

* * * * *